United States Patent
Yoshida et al.

(10) Patent No.: US 8,904,335 B2
(45) Date of Patent: Dec. 2, 2014

(54) EVALUATION OF PIN GEOMETRY ACCESSIBILITY IN A LAYER OF CIRCUIT

(71) Applicant: GLOBALFOUNDRIES Inc., Grand Cayman (KY)

(72) Inventors: Hidekazu Yoshida, San Jose, CA (US); Lei Yuan, Cupertino, CA (US); Paul Mesa, Union City, CA (US)

(73) Assignee: GLOBALFOUNDRIES, Inc., Grand Cayman (KY)

(*) Notice: Subject to any disclaimer, the term of this patent is extended or adjusted under 35 U.S.C. 154(b) by 0 days.

(21) Appl. No.: 13/849,575

(22) Filed: Mar. 25, 2013

(65) Prior Publication Data

US 2014/0289695 A1 Sep. 25, 2014

(51) Int. Cl.
 *G06F 17/50* (2006.01)
(52) U.S. Cl.
 CPC .................................. *G06F 17/5081* (2013.01)
 USPC ......................................................... 716/136
(58) Field of Classification Search
 USPC ................................. 716/100, 136
 See application file for complete search history.

(56) References Cited

U.S. PATENT DOCUMENTS

| | | | | |
|---|---|---|---|---|
| 4,613,941 | A * | 9/1986 | Smith et al. | 716/55 |
| 6,188,242 | B1 * | 2/2001 | Mahajan et al. | 326/41 |
| 6,543,040 | B1 * | 4/2003 | Bednar et al. | 716/127 |
| 6,883,155 | B2 * | 4/2005 | Bednar et al. | 716/127 |
| 7,096,436 | B2 * | 8/2006 | Bednar et al. | 716/126 |
| 8,640,080 | B1 * | 1/2014 | Salowe et al. | 716/139 |
| 2003/0204829 | A1 * | 10/2003 | Bednar et al. | 716/12 |
| 2005/0039153 | A1 * | 2/2005 | Bednar et al. | 716/12 |
| 2005/0076319 | A1 * | 4/2005 | Chow et al. | 716/10 |
| 2009/0100397 | A1 * | 4/2009 | Palumbo et al. | 716/9 |

* cited by examiner

*Primary Examiner* — Suchin Parihar
(74) *Attorney, Agent, or Firm* — Matthew M. Hullhan, Esq.; Heslin Rothenberg Farley & Mesiti, P.C.

(57) ABSTRACT

Evaluation of electrical accessibility within a layer of a circuit to pin geometries residing within a cell boundary of the circuit is provided. The evaluating includes, for instance, checking along substantially parallel pin geometry access paths of the layer to determine possible points at which a respective pin geometry of the pin geometries within the cell boundary may be accessed. The evaluating also includes identifying which points of the possible points are accessible access points by any route of the possible routes for electrically connecting to a respective pin geometry of the pin geometries from a first side or a second side of the cell boundary, wherein at least one point of the possible points is identified as not being an accessible access point based on the at least one point being inaccessible by the possible routes.

20 Claims, 8 Drawing Sheets

EVALUATION OF PIN GEOMETRY ACCESSIBILITY IN A LAYER OF CIRCUIT

BACKGROUND OF THE INVENTION

Efficient usage of Back End of Line (BEOL) routing resources continues to be an important factor in achieving reduction in both die scale and costs of chip design. Emphasis is typically placed on narrowing the wire pitch and overall footprint of chip components, particularly in heavy traffic areas such as the Metal-2 (M2) and Metal-3 (M3) layers. Despite these efforts, space constraints in heavy traffic area continues to be an issue in need of improvement especially as demand rises for more complex chips of increasingly smaller sizes.

BRIEF SUMMARY

The shortcomings of the prior art are overcome and additional advantages are provided through the provision of a method which includes evaluating electrical accessibility within a layer of a circuit to at least one pin geometry residing within a cell boundary of the circuit, the evaluating including: checking along a plurality of substantially parallel pin geometry access paths of the layer to determine a plurality of possible points at which a respective pin geometry of the at least one pin geometry within the cell boundary may be accessed, the pin geometry access paths being paths for possible routes of electrical connections in the layer of the circuit; and identifying, by a processor, which points of the possible points are accessible access points by any route of the possible routes for electrically connecting to a respective pin geometry of the at least one pin geometry from a first side or a second side of the cell boundary, wherein at least one point of the plurality of possible points is identified as not being an accessible access point based on the at least one point being inaccessible by the possible routes.

In a further aspect, a system is provided which includes a memory and a processor in communication with the memory. The system is configured to perform a method which includes, for instance: evaluating electrical accessibility within a layer of a circuit to at least one pin geometry residing within a cell boundary of the circuit, the evaluating including: checking along a plurality of substantially parallel pin geometry access paths of the layer to determine a plurality of possible points at which a respective pin geometry of the at least one pin geometry within the cell boundary may be accessed, the pin geometry access paths being paths for possible routes of electrical connections in the layer of the circuit; and identifying which points of the possible points are accessible access points by any route of the possible routes for electrically connecting to a respective pin geometry of the at least one pin geometry from a first side or a second side of the cell boundary, wherein at least one point of the plurality of possible points is identified as not being an accessible access point based on the at least one point being inaccessible by the possible routes.

In yet a further aspect, a computer program product is provided which includes a tangible storage medium storing program instructions readable by a processor for execution to perform a method which includes, for instance: evaluating electrical accessibility within a layer of a circuit to at least one pin geometry residing within a cell boundary of the circuit, the evaluating including: checking along a plurality of substantially parallel pin geometry access paths of the layer to determine a plurality of possible points at which a respective pin geometry of the at least one pin geometry within the cell boundary may be accessed, the pin geometry access paths being paths for possible routes of electrical connections in the layer of the circuit; and identifying which points of the possible points are accessible access points by any route of the possible routes for electrically connecting to a respective pin geometry of the at least one pin geometry from a first side or a second side of the cell boundary, wherein at least one point of the plurality of possible points is identified as not being an accessible access point based on the at least one point being inaccessible by the possible routes.

Additional features and advantages are realized through the concepts of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Evaluation of electrical accessibility to pin geometries within a layer of a circuit is described herein. A "pin" refers generally to any component to which an electrical connection is desired within a circuit. The term "pin geometry" is typically used to refer to the representation of a pin in a computerized design of the circuit using design software, such as an Electric Design Automation (EDA) package. Aspects described herein deal with pin geometry accessibility evaluation during this design phase of the circuit, though the terms pin and pin geometry are used interchangeably herein. Evaluation of pin geometry accessibility as described herein may be made for any layer of a circuit layout, though the evaluation can be particularly advantageous when evaluating Metal-1 (M1) pin accessibility.

Upper level metallization layers, such as Metal-2 (M2) and Metal-3 (M3) BEOL layers, usually see the highest concentration of wire routing. Even higher level (i.e. M4, M5, etc.) layer(s) are used when resource availability in the M2 and/or M3 layers cannot support the demand of additional connections or components. This results in larger chip sizes, which is generally not desired. Optimization of M2 and M3 traffic is a key component to efficient chip space utilization. Aspects of the present invention provide pin geometry accessibility evaluation. The evaluation can be used to identify routability between M1 components without having to jump to higher level layers, enabling wire routings that would otherwise exist in these upper-level layers to be relocated (e.g. to an underlying layer, such as M1). Traffic density within the M2 (and higher) layers is reduced, facilitating, for instance, reduction in chip size, incorporation of addition chip components, or both.

Aspects described herein facilitate evaluation of pin geometry accessibility in a layer, such as an M1 layer, of a circuit. By evaluating the accessibility of pin geometries in the M1 layer, routings between pins within the M1 layer that conventionally would be made by way of higher level layers, such as M2 and/or M3, may be relocated to within the M1 layer. By opening the M1 layer to include routes between pins thereof routability can be improved because M2 and M3 density can be relaxed without the need to add an additional level to achieve additional wire routability. In one example, the evaluation is carried out by one or more data processing systems that generate a pin access constraint file describing accessibility to pin geometries within the target layer. Manual generation of such a pin access constraint file would be practically impossible and prone to error for chip layouts that include possibly hundreds of thousands of cells.

Figure 1:
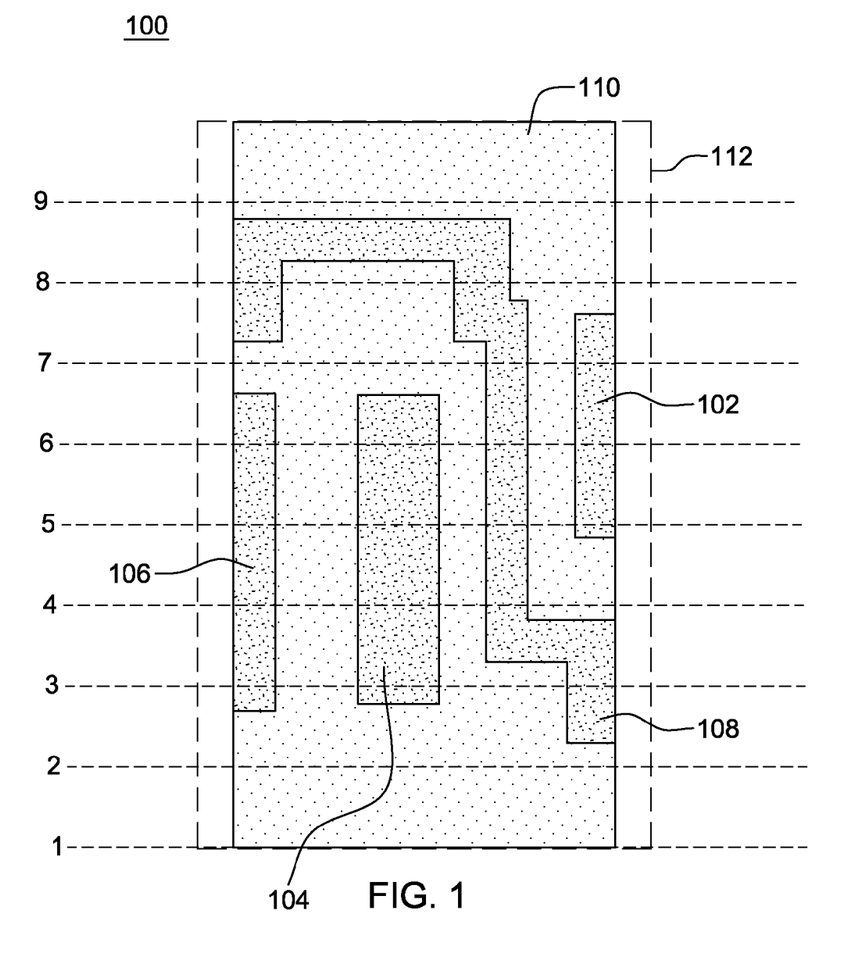
FIG. 1 depicts an example layout of a cell of a circuit with pin geometries disposed in a layer of the circuit.

FIG. 1 depicts an example layout of a cell of a circuit with pin geometries disposed in a layer of the circuit. The perspective of FIG. 1 is an overhead view of the layout within the layer of the cell of the circuit. Cell 100 includes pin geometries 102, 104, 106 and 108 residing in a layer (M1 in this example) of cell 100. Pin geometries 102, 104, 106, and 108 are, in one example, copper pins surrounded by dielectric material 110. The circuit layout may provide that pins 102, 104, 106, and 108 are to be connected to other components (not pictured), for instance that pin 102 is be connected to an adjacent cell by way of a metal route.

Pins 102, 104, 106, and 108 reside within cell boundary 112 and can be accessed for electrical connection by metal routes that can be routed along pin geometry access paths 1-9 (shown as dashed lines in FIG. 1). Pin geometry access paths represent the possible routes for electrical connections to be made to pins 102, 104, 106, and 108. These routes enable access to pin geometries 102, 104, 106, and 108 from first and/or second sides of the cell boundary (i.e. the left side or right side in this example of cell boundary 112). Pin geometry access paths 1-9 are spaced substantially evenly apart, i.e. are parallel, and this spacing represents the pitch of the circuit design. In a 20 nanometer process node, this pitch is 64 nanometers, as an example, though the pitch may be even smaller in smaller (e.g. 10 nanometer) process nodes.

As described in further detail below, accessibility of pin geometries 102, 104, 106, and 108 along access paths 1-9 is evaluated by checking whether a point at which a pin geometry access path intersects a pin is capable of being accessed if a route to that point were placed along the pin geometry access path. Obstructions or other features of the design may prohibit a route along a particular path from accessing the pin.

Using the example of FIG. 1, the evaluation may identify that pin 104 is being completely blocked from access because, for each of the pin geometry access path that intersects pin 104 (e.g. paths 3, 4, 5 and 6), the route along that path from both the left and the right sides of the cell boundary are blocked from accessing pin 104. That is, pin 104 is blocked by pin 106 (on the left side of the cell boundary) and blocked by pins 102 and 108 (on the right side of the cell boundary).

A circuit layout is input by a user into an Electric Design Automation (EDA) package, and the pin geometries are expressed as polygon data in the corresponding data file. The de facto standard file format used in the industry is the Library Exchange Format Clef) file format, though aspects described herein apply to any other format for specifying a physical layout of a circuit.

A pin extending in only a vertical or horizontal direction, such as pins 102, 104, and 106 of FIG. 1, is expressed as a basic quadrilateral polygon. A more complex pin extending both directions (such as pin 108 of FIG. 1) is expressed as a collection of polygons. Depending on how the polygon data is specified, it may need to be converted into a different format to facilitate aspects described herein. This is described and depicted with reference to FIGS. 2A-2D, which depict example conversions of pin geometry specifications from a first polygonal specification format to a second polygonal specification format, in accordance with aspects described herein.

Figure 2A:
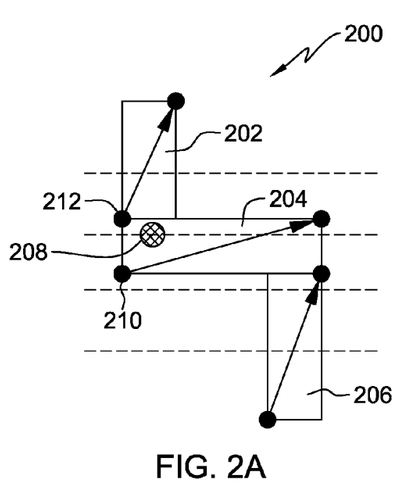
FIGS. 2A-2D depict example conversions of pin geometry specifications from a first polygonal specification format to a second polygonal specification format, in accordance with aspects described herein.
Figure 2B:
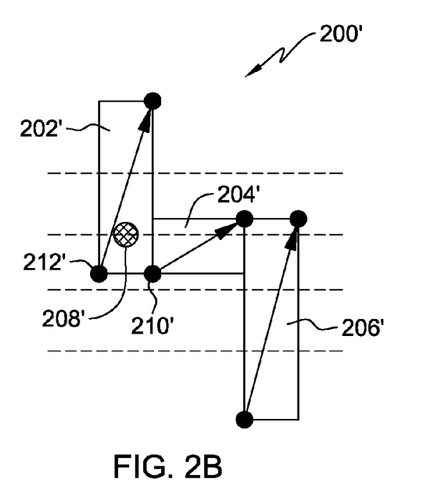

In FIG. 2A, pin 200 is specified by polygons 202, 204, and 206 in a 'horizontal cut' specification format. In this format, each horizontal segment of the pin is expressed by a single polygon (204), and vertical polygons (202 and 206) are added to complete the vertical segments of the pin. In accordance with aspects described herein, pin geometry specification conversion is provided. FIG. 2B depicts the same pin geometry, this time specified in a 'vertical cut' specification format. In this format, each vertical segment of pin 200' is expressed by a single polygon (202' and 206'), and the horizontal portion is completed by polygon 204'. Thus, pin 200' is specified by polygons 202', 204', and 206'.

It is seen that by the conversion, coverage of polygon 202 is expanded vertically downward (see e.g. 202'), and coverage of polygon 206 is expanded vertically upward (see e.g. 206'), while coverage of polygon 204 is contracted (see e.g. 204'). The expansion supports processes described below in which possible points for accessing the pin are evaluated. By changing the specification format from horizontal cut to vertical, a maximum vertical coverage of each polygon is achieved. This maximizes the number of horizontal pin geometry access paths that will intersect a given polygon, and therefore the number of possible points at which the pin geometry may be accessed.

Using FIG. 2A as an example, point 208 will be identified as being a possible point for accessing pin 200. However, for reasons described below, the point may be eliminated as being inaccessible by a route because point 208 is not sufficiently enclosed within the polygon in which point 208 resides (e.g. polygon 204). By converting to the vertical polygonal specification format as depicted in FIG. 2B, point 208 will not necessarily be eliminated as being inaccessible, because polygon 202 has been expanded to include that point (point 208'). Point 208' is sufficiently enclosed by the polygon (202') in which it resides.

Note that the terms 'horizontal' and 'vertical' are relative terms used for description purposes only; it does not necessarily imply an actual orientation of the pin in the manufactured circuit.

Accordingly, a process may be provided for converting from a first polygonal specification format to a second polygonal specification format. The process obtains a circuit layout data file, such as a .LEF file, with pins defined as one or more polygons, each having polygon specification coordinates. Then, for each pair of abutting polygons, polygon specification coordinates may be modified to convert the polygon pair from one polygonal specification format to another polygonal specification format, such from a horizontal polygonal specification format to a vertical polygonal specification format.

Rectangular quadrilateral polygons may each be expressed using two coordinate pairs. For each pair of abutting polygons, their formation is either in an 1' shape (perhaps mirrored or rotated), or a T shape, perhaps rotated. The process for converting between specification formats can modify these polygon specification coordinates to convert the specification format from a horizontal format to a vertical format. For instance, using polygons 202 and 204 of FIG. 2A as an example, the polygons form an 1' shape. To convert polygon 204 to 204', the lower left coordinate 210 is shifted horizontally by the width of polygon 202 (e.g. to 210' of FIG. 2B). The lower left coordinate 212 of polygon 202 is shifted downward, expanding polygon 202, to the position of 212'. The process is similar for other polygon pairs forming an 'L' shape, or a rotated or mirrored version thereof.

Figure 2C:
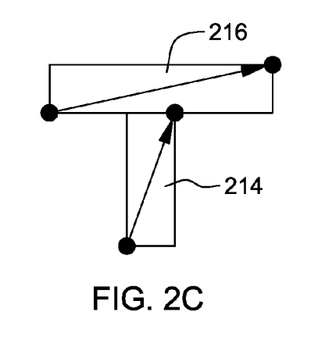
Figure 2D:
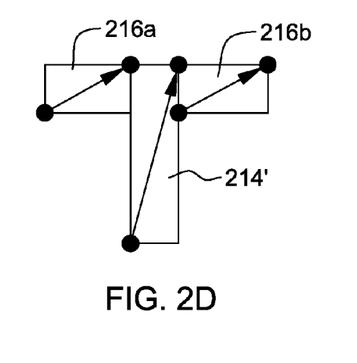

FIGS. 2C and 2D depicts conversion a polygon pair forming a 'T' shape. Vertical polygon 214 is expanded (upward in this example) into polygon 214', while polygon 216 is split into two polygons, 216a and 216b (FIG. 2D).

In the above examples, the pin geometry specification format is converted from the horizontal cut to the vertical cut, though more generally, the specification format may be converted from a first specification format to a second specification, where the second specification format is for a direction orthogonal to the pin access paths. In the example above, the pin geometry access paths traverse the cell horizontally, from left to right. Thus, the desired polygonal specification format is a 'vertical cut' to expand polygons of the pin geometry in the vertical direction, orthogonal to the horizontally oriented pin geometry access paths.

Figure 3:
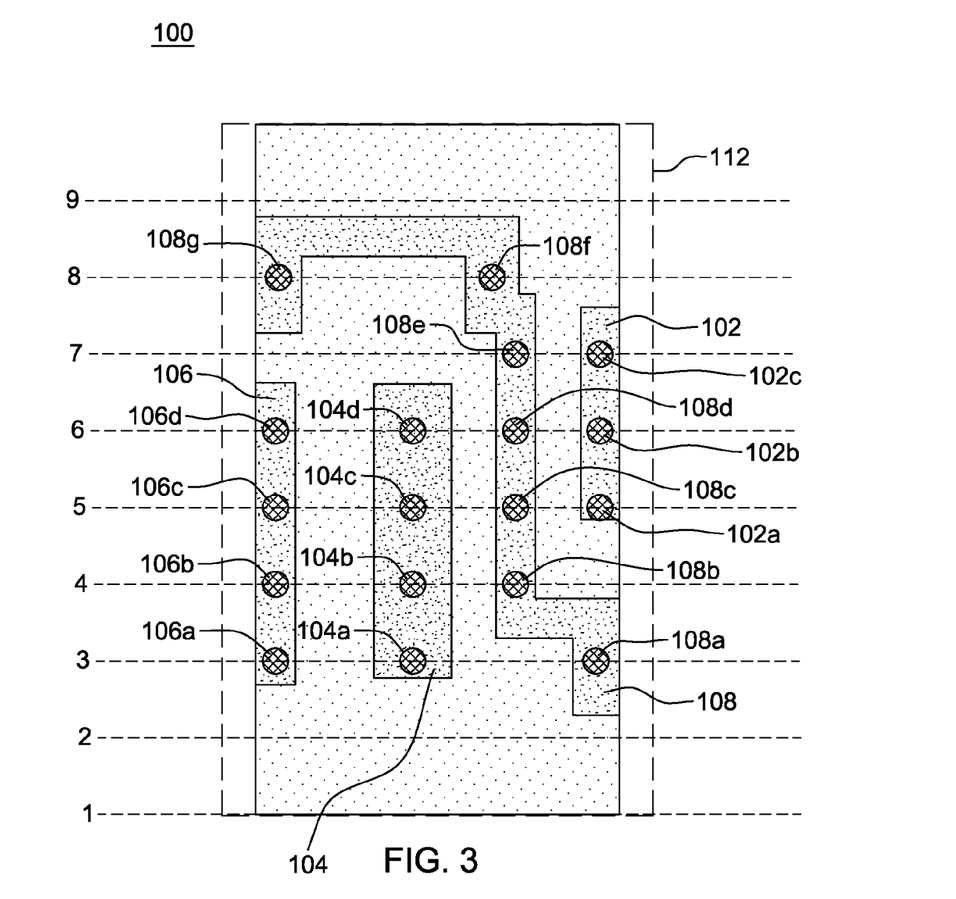
FIG. 3 depicts the circuit layout of FIG. 1 with identification of possible points at which the pin geometries may be accessed along pin geometry access paths, in accordance with aspects described herein.

After the format conversion, a determination is made of possible points at which each pin geometry may be accessed by checking along the pin geometry access paths. This is described and depicted with reference to FIG. 3. FIG. 3 depicts cell 100 and pin geometry access paths 1-9 (FIG. 1) traversing across cell boundary 112. The checking will identify points where pin geometry access paths extend through a portion of a pin geometry. For instance access path 3 in FIG. 3 extends through pins 104, 106 and 108. Accordingly, points 104a, 106a, and 108a are identified for pins 104, 106 and 108, respectively. Along path 4, pins 104b, 106b, and 108b are identified for pins 104, 106, and 108 (respectively). Additional possible points are identified for the other access paths. The following possible points are identified in FIG. 3: for pin 102: points 102a, 102b, and 102c; for pin 104: points 104a, 104b, 104c, and 104d; for pin 106: points 106a, 106b, 106c, and 106d; and for pin 108: points 108a, 108b, 108c, 108d, 108e, 108f, and 108g.

Indications of the possible points for accessing the pin geometries of a cell may be stored for further processing of the data. The track interaction with the polygon data may be recorded with the interaction depth where a wire track (route) interacts with a polygon of a pin. The following represents one example of the stored data, arranged by pin geometry access path (termed "Track" in this example), and the data format is as follows: "[X coordinate at an access-point] [track enclosure depth from pin geometry] [pin name]: . . . "

Track 1 pin avail:
 #Track 2 pin avail:
 #Track 3 pin avail: 209 13 B: 389 43 Z: 29 31 OBS: 45 31 OBS:
 #Track 4 pin avail: 209 77 B: 389 107 Z: 119 31 OBS:
 #Track 5 pin avail: 29 33 A: 209 141 B: 389 171 Z: 299 31 OBS: 119 31 OBS:
 #Track 6 pin avail: 29 97 A: 209 105 B: 389 171 Z: 299 31 OBS: 119 31 OBS:
 #Track 7 pin avail: 29 77 A: 209 41 B: 389 107 Z: 299 31 OBS: 119 31 OBS:
 #Track 8 pin avail: 29 13 A: 389 43 Z: 299 31 OBS: 119 31 OBS:
 #Track 9 pin avail:

This above data enables evaluation at each point from the left and/or right sides of each point to identify which are accessible access points. The data above also shows obstruction points as "OBS". This is described further below with reference to FIG. 4A.

Figure 4A:
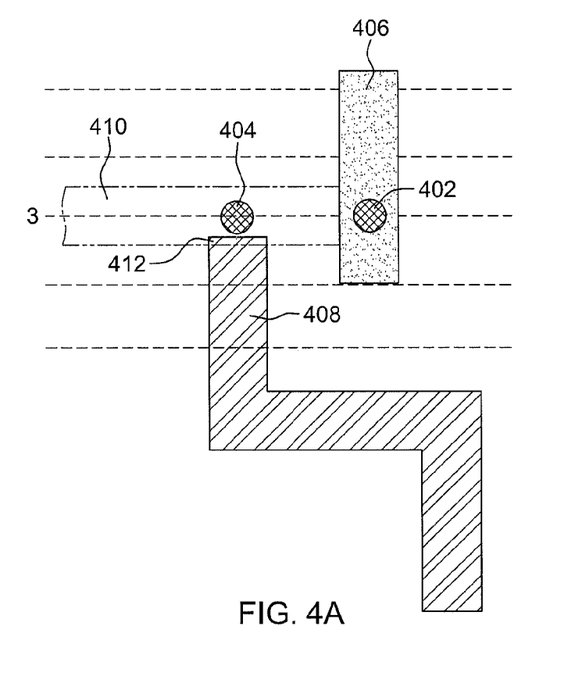
FIG. 4A illustrates an example usage of a non-pin geometry blocking point to indicate a blockage from accessing a pin geometry, in accordance with aspects described herein.

In one example, identification is made of which points of the possible points are accessible along the pin geometry access path. Part of this consideration involves determining, for each possible point, whether the point is, in fact, accessible if a route to that point was to be made along that access path. There may exist possible obstructions along that path, such as one or more pin geometries or non-pin geometries, that would prevent a route from reaching the point on the pin. FIG. 4A illustrates an example usage of a non-pin geometry blocking point to indicate a blockage from accessing a pin geometry, in accordance with aspects described herein. In FIG. 4A, a possible access point 402 has been identified for pin 406. However, a non-pin geometry 408 (such as an interconnect) is positioned such that if a route (410 in this example) were placed leading to pin 406, the route would be partially blocked by non-pin geometry 408. The overlapping portion 412 in FIG. 4A illustrates the partial blockage due to non-pin geometry 408 extending too far upward that it would be in the path of route 410, if it were to be etched. Such an obstruction is not desired. In some examples, even if non-pin geometry 408 did not extend into the path of route 410, but were sufficiently close that it would cause interference or other issues, it may be desired to eliminate point 402 as inaccessible for that reason.

In accordance with an aspect described herein, a non-pin geometry blocking point 404 may be identified and included as a dummy point in the collection of possible points identified above. The blocking point indicates a blockage due to an obstruction, such as the positioning of a non-pin geometry of the circuit. Placement of the dummy point indicates that pin 402 is not accessible from the left side (in FIG. 4A) because, in this case, a non-pin geometry extends into the path of the hypothetical route 410 to point 402. Inclusion of these dummy points facilitates a process described below where the possible points are evaluated to determine whether they are accessible.

In other examples, block points may be used when other pin geometries extend sufficiently close to a pin access path that any route along that path, should it be etched, would interact or abut the pin. In this manner, dummy points can be added along a path when other chip components would prevent a route from passing along that path to a destination point that is enclosed within a pin geometry.

Figure 4B:
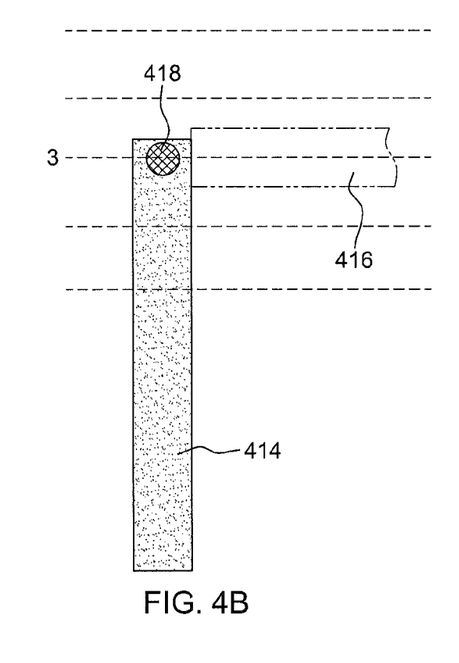
FIG. 4B illustrates a scenario in which a possible point for accessing a pin geometry is not sufficiently enclosed within a pin for electrical connection to a route.

FIG. 4B illustrates a scenario in which a possible point for accessing a pin geometry is not sufficiently enclosed within a pin for electrical connection to a route. Point 418 illustrates an example of a point that is not sufficiently enclosed within a pin, rendering the pin incapable of being properly accessed by a route to that point. Although point 418 along path 3 is enclosed within pin 414, point 418 resides too close to the top end of pin 414, such that it is not sufficiently enclosed by pin 414. The thickness of hypothetical route 416 from the right side is such that it does not completely abut pin 414. Interaction between route 416 and pin 414 may not be sufficient to enable a suitable electrical connection between pin 414 and route 416, thus necessitating the elimination of point 418 as a possible point for accessing pin 414. In one example, it is determined whether enough enclosure exists such that it is greater than or equal to the sum of half the via cut plus the via/M1 layer enclosure criteria (i.e. how much additional enclosure beyond the via cut is needed.

Figure 5:
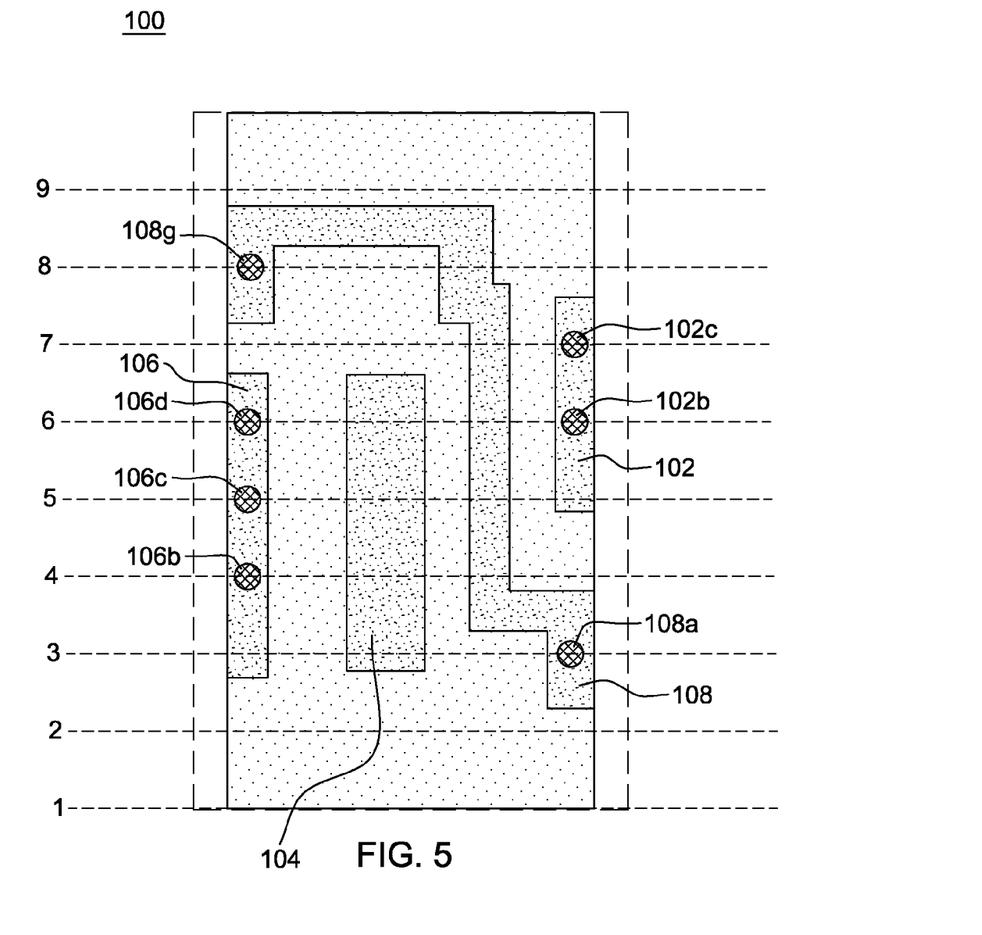
FIG. 5 depicts the circuit layout of FIG. 3 with identification of which of the possible points for access are accessible by a route along a pin geometry access path, in accordance with aspects described herein.

FIG. 5 depicts the circuit layout of FIG. 3 after it has been identified which of the possible points for access are accessible by a route along a pin geometry access path, in accordance with aspects described herein. A process is followed to identify which of the possible points are accessible by some route along a pin geometry access path, and which of the possible points are not. For each point, it is determined whether the point may be accessed from either of the left side or the right side of the chip. For instance, referring to FIG. 5, point 108g of pin 108 is accessible from the left side of chip 100, i.e. by a route made along pin geometry access path 8. Points 106d, 106c, and 106b are similarly accessible from the left side of chip 100 along paths 4, 5, and 6. From the right side of chip 100, points 102c and 102b of pin 102, and point 108a of pin 108 are accessible. These are the points (of the possible points identified above) that are identified as being accessible access points for electrically connecting to the respective pin geometry.

All points of pin 104 (104a, 104b, 104c, and 104d—see FIG. 3) are identified as not being accessible access points, since they are blocked from being accessed by routes from both the left and right sides, i.e. blocked form access from the left by pin 106 and blocked from access from the right by pins 108 and 102.

Additionally, points 108c, 108d, and 108e (see FIG. 3) are also blocked from being accessed from each of the left and right sides of the chip. Pin 102 blocks access from the right side along paths 5, 6, and 7, and pins 106 and 104 block access to points 108c and 108d from the left side along paths 5 and 6. Also, pins 106, 104, and 108 extend too close to access path 7 in this example such that they would block a route from the left side along path 7 from accessing point 108e. In this regard, a blocking point may have been identified, as described above, on path 7 between pins 106 and 108 to indicate a blockage along path 7 to point 108e due to pins 106 and/or 108.

Points 106a (pin 106) and 102a (pin 102) have also eliminated because they are not sufficiently enclosed within their respect pin such that a route to that point (i.e. along access path 3) can form a proper electrical connection to the pin. Furthermore, points 108b and 108f are not accessible in this example because (i) they are being blocked from access from the left side, and (ii) pin geometry 108 itself would interfere with a route along path 3 or 8 to from the right side.

A process is provided herein for identifying which point of the possible points identified above are accessible access points by a route along a pin geometry access path. For each of the possible points, it is checked whether the point is the leftmost point of the cell along that access path, or the rightmost point of the cell along that access path. Points that are neither the leftmost point nor the rightmost point are identified as not being accessible access points. Further, for each of the remaining points, it can be determined whether the point is sufficiently enclosed within the pin in which it resides. If not, the point may be identified as not being an accessible access point. Yet further, it can be determined whether or not an obstruction exists sufficiently close to the access path, such that it would prevent a route from accessing the point from the right or left side of the chip. If such access would be prevented, that point may be identified as not being an accessible access point.

Initially, indications of the possible points may be maintained in a data structure, and data for any point of those possible points that is identified as not being an accessible access point can be removed from the data structure. The remaining points are the points identifies as being accessible access points of the chip. The data structure can indicate leftmost and rightmost pins, by pin geometry access path, and can further indicate, for each pin, the access path(s) by which the pin is accessible. For instance, the data can indicate the following (where "Track[x]" indicates point geometry access path x):

Track[1] Both=; Left Most Pin=; Right Most Pin=;
Track[2] Both=; Left Most Pin=; Right Most Pin=;
Track[3] Both=; Left Most Pin=B; Right Most Pin=Z;
Track[4] Both=; Left Most Pin=B; Right Most Pin=;
Track[5] Both=; Left Most Pin=B; Right Most Pin=;
Track[6] Both=; Left Most Pin=B; Right Most Pin=A;
Track[7] Both=; Left Most Pin=B; Right Most Pin=A;
Track[8] Both=; Left Most Pin=B; Right Most Pin=;
Track[9] Both=; Left Most Pin=; Right Most Pin=;

The above data can advantageously assist in the design of the circuit by, for instance, identifying possible opportunities to access a pin in a given layer without having to jump up to a higher level layer to make the route and then penetrate back down to access the pin, as one example. Adjacent cells may be electrically connected through, for instance, an underlying (e.g. M1) layer instead of through a connection made by way of one or more upper-level layers.

A software utility can be provided that accepts as parameters a circuit design specified as an Electronic Design Automation (EDA) file, such as a .LEF file, and an indication of the pitch (e.g. spacing between pin geometry access paths) for the layer of the circuit for which pin geometry accessibility is being evaluated. The utility, e.g. software that executes on a processor, in one example, may evaluate cell properties, such as cell height, pin names, pin geometry polygon location information, and obstruction location information, and identify access points to the pin geometries, which access points are accessible by route(s) placed along pin geometry access path(s). The utility can output/save constraint information indicating which pins pay be accessed, along which access paths the pins may be accessed, and from which direction along those paths they may be accessed.

An example of output constraint information is:
LIB_CELL_NAME: t9_an2x1_znr
PIN_NAME: A
LEFT_TRACK:3 5 6 7//LEFT access, 3 tracks available, track #s 5, 6 and 7
LIB_CELL_NAME: t9_an2x1_znr
PIN_NAME: Z
RIGHT_TRACK: 3 4 5 6 7 8//RIGHT access, 3 tracks available, track #s 3 4 5 6 7 8

The above indicates that, for cell t9_an2x1_znr, pin A is accessible from the left side of the cell along tracks 3, 5, 6 and 7, and pin Z is accessible from the right side of the cell along tracks 3, 4, 5, 6, 7, and 8.

According to aspects described herein, a process for evaluating electrical accessibility within a layer of a circuit to pin geometries within a cell boundary of a circuit from a layer of the circuit, in accordance with aspects described herein. An example such process is described and depicted with reference to FIG. 6.

Figure 6:
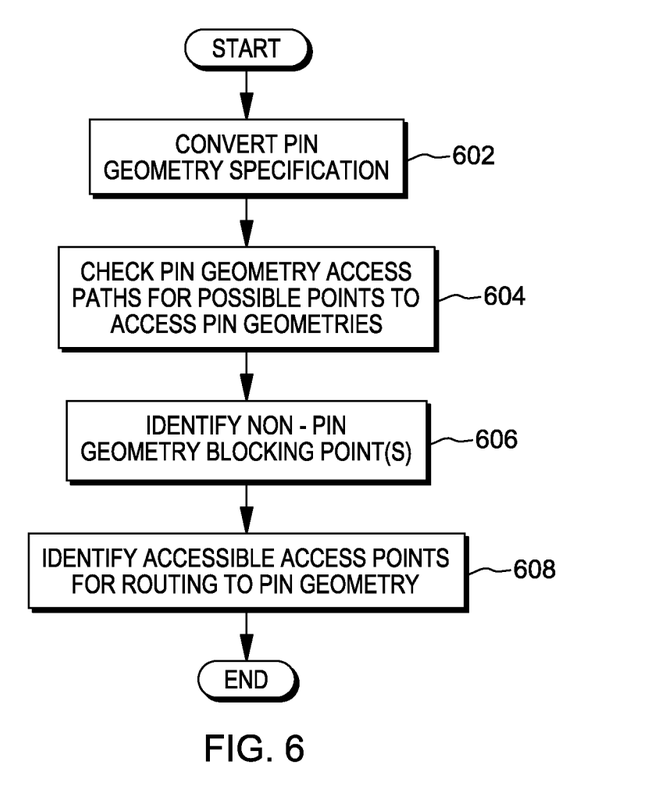
FIG. 6 depicts an example process for evaluating electrical accessibility within a layer of a circuit to pin geometries within a cell boundary of the circuit, in accordance with aspects described herein.

Initially, if necessary, a pin geometry specification is converted from a first polygonal specification format to a second polygonal specification format (602). The conversion expands coverage of the polygons of the pin geometries in at least one direction, i.e. orthogonal to the pin geometry access paths, and this expansion maximizes a number of possible points at which the pin geometry may be accessed. If the polygon data for the pin geometries of the design of the circuit is already in the proper polygonal specification format, then the conversion may not be necessary.

Next, a check is made across the pin geometry access paths of the layer to determine possible points that may be used to access the respective pin geometries (604). Each of these possible points may be used to access a respective pin geometry. The pin geometry access paths are the paths for possible routes of electrical connections in the layer of the circuit. That is, they represent the tracks along which routes might be placed to access the pins. The pin geometry access paths traverse the cell boundary from one side to the other side of the cell, such that the pins can be accessed from either of opposing sides of the cell. In the example figures described herein, the access paths traverse the cell horizontally, as depicted.

The process continues by identifying any non-pin geometry blocking points (606). A blocking point is added along a pin geometry access path when some geometry of the circuit layer, such as a non-pin geometry, like an interconnect, prohibits a route from being placed along the access path. In some examples, the proximity of the non-pin geometry to the access path is such that it would interfere with a route placed along that path. Thus, to facilitate further aspects of the process, a dummy blocking point is inserted along the path approximately near the site of the obstruction to indicate blockage of a route along that path from extending beyond that blocking point, i.e. to an otherwise-accessible access point identified by 604.

After checking for possible points to access the pin geometries and identifying blocking points, the process continues by identifying which points of the possible points are accessible access points for electrically connecting to respective pin geometries (608). Possible routes may be routed along the pin geometry access paths from the sides of the cell boundary. The identifying determines, for each point of the possible points, whether a route to that point is being obstructed from accessing the point from the sides of the cell. Possible obstructions include other possible access points disposed along that access path and corresponding to other pin geometries. Other possible obstructions include blocking points inserted along the access path based on the presence of other circuit geometries, such as non-pin geometries. In this manner, a point may be determined to be inaccessible based, at least in part, on a non-pin geometry blocking point indicating a blockage of the route from accessing the point from at least one of the first side or the second side.

When the route to a point is being obstructed from accessing the point from both sides (e.g. left and right) of the point, it is identified as not being an accessible access point.

Additionally, the identifying determines, for each point of the possible points, whether the point is sufficiently enclosed within the pin geometry accessible at that point. A point is identified as not being an accessible access point based, at least in part, on that point not being sufficiently enclosed within the pin geometry accessible at that point.

In some embodiments, the layer of the circuit is a Metal-1 (M1) layer in which multiple pin geometries reside, and the evaluation described above evaluates electrical accessibility for M1 routes in the M1 layer to the M1 pin geometries. This evaluation of electrical accessibility in the M1 layer can open the M1 layer to possible intra-layer routes between pins thereof, instead of jumping to high-level layers to achieve those routings. Accordingly, density in the upper level layers, such as Metal-2 and Metal-3 can be relaxed. In experiments utilizing aspects described herein, identification of routability opportunities in the Metal-1 layer facilitated relocation of routes to the Metal-1 layer and enabled a 5 to 10% reduction in scale (die area utilized) of the circuit design, in some instances. In one particular application, the evaluation of M1 route accessibility enables adjacent cells to be interconnected by routes within the M1 layer, rather than, for instance, jumping to a higher-level layer to make the connection between the two cells.

Those having ordinary skill in the art will recognize that aspects of the present invention may be embodied in one or more systems, one or more methods and/or one or more computer program products. In some embodiments, aspects of the present invention may be embodied entirely in hardware, entirely in software (for instance in firmware, resident software, micro-code, etc.), or in a combination of software and hardware aspects that may all generally be referred to herein as a "system" and include circuit(s) and/or module(s).

Figure 7:
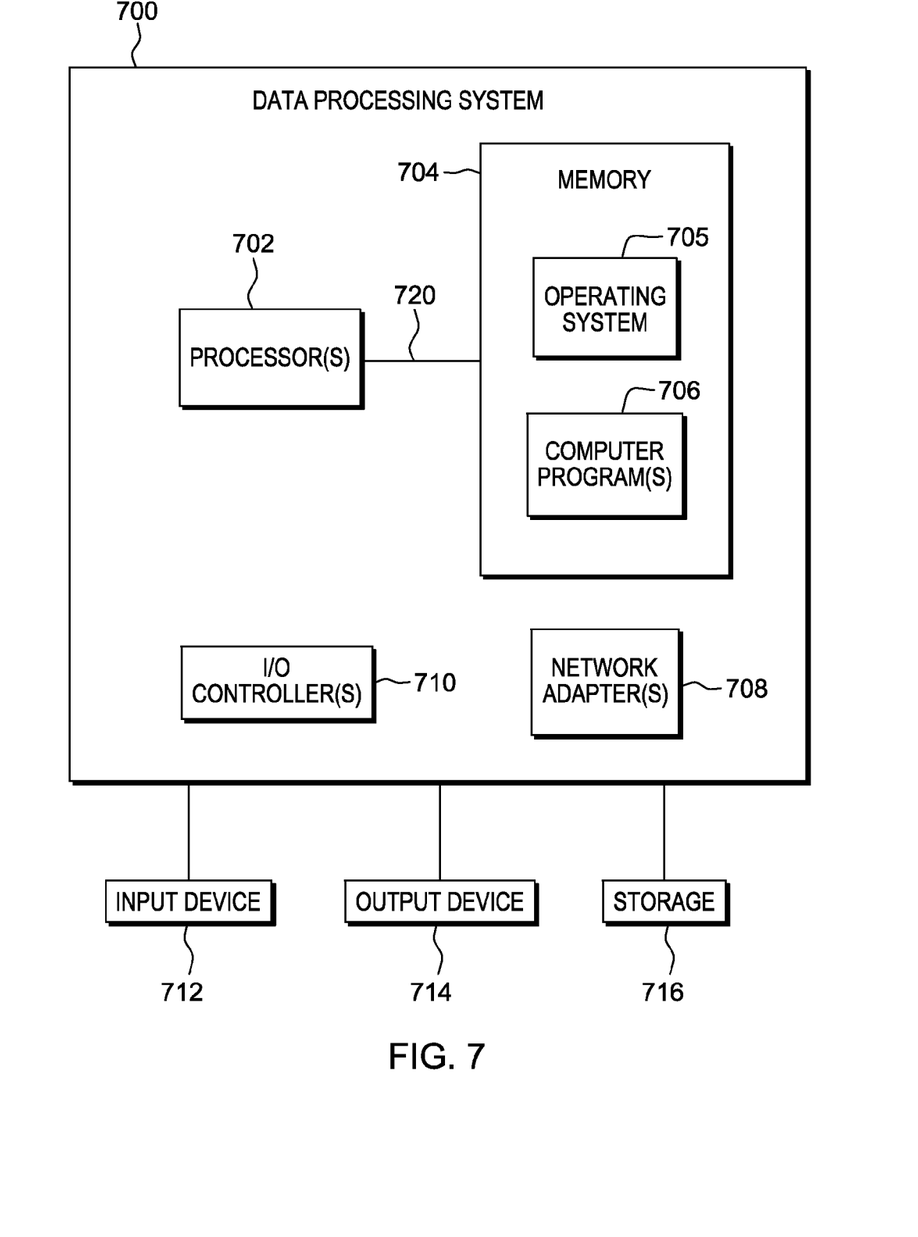
FIG. 7 depicts one example of a data processing system to incorporate and use one or more aspects described herein.

FIG. 7 depicts one example of a data processing system to incorporate and use one or more aspects of the present invention. Data processing system 700 is suitable for storing and/or executing program code, such as program code for performing processes described above, and includes at least one processor 702 coupled directly or indirectly to memory 704 through, a bus 720. In operation, processor(s) 702 obtain from memory 704 one or more instructions for execution by the processors. Memory 704 may include local memory employed during actual execution of the program code, bulk storage, and cache memories which provide temporary storage of at least some program code in order to reduce the number of times code must be retrieved from bulk storage during program code execution. A non-limiting list of examples of memory 704 includes a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Memory 704 includes an operating system 705 and one or more computer programs 706, such as one or more Electric Design Automation packages and/or one or more programs for execution to perform aspects described herein. In one particular example, a program accepts a library exchange format Clef) file and evaluates electrical accessibility to geometries defined therein within a layer of the circuit design. The program performs the process of FIG. 6, described above, and outputs and/or saves a constraint file indicating the identified accessible access points. This constraint file may then be used in establishing routes within the layer that access one or more of the accessible access points.

Input/Output (I/O) devices 712, 714 (including but not limited to keyboards, displays, pointing devices, etc.) may be coupled to the system either directly or through I/O controllers 710.

Network adapters 708 may also be coupled to the system to enable the data processing system to become coupled to other data processing systems through intervening private or public networks. Modems, cable modem and Ethernet cards are just a few of the currently available types of network adapters 708. In one example, network adapters 708 facilitate obtaining data from remote sources to facilitate aspects of the present invention.

Data processing system 700 may be coupled to storage 716 (e.g., a non-volatile storage area, such as magnetic disk drives, optical disk drives, a tape drive, etc.), having one or more databases. Storage 716 may include an internal storage device or an attached or network accessible storage. Computer programs in storage 716 may be loaded into memory 704 and executed by a processor 702.

The data processing system 700 may include fewer components than illustrated, additional components not illustrated herein, or some combination of the components illustrated and additional components. Data processing system 700 may include any computing device, such as a mainframe, server, personal computer, workstation, laptop, handheld computer, telephony device, network appliance, virtualization device, storage controller, etc.

In addition, processes described above may be performed by multiple data processing systems 700, working as part of a clustered computing environment.

In some embodiments, aspects of the present invention may take the form of a computer program product embodied in one or more computer readable medium(s). The one or more computer readable medium(s) may have embodied thereon computer readable program code. Various computer readable medium(s) or combinations thereof may be utilized. For instance, the computer readable medium(s) may include a computer readable storage medium, examples of which include (but are not limited to) one or more electronic, magnetic, optical, or semiconductor systems, apparatuses, or devices, or any suitable combination of the foregoing. Example computer readable storage medium(s) include, for instance: an electrical connection having one or more wires, a portable computer diskette, a hard disk or mass-storage device, a random access memory (RAM), read-only memory (ROM), and/or erasable-programmable read-only memory such as EPROM or Flash memory, an optical fiber, a portable compact disc read-only memory (CD-ROM), an optical storage device, a magnetic storage device (including a tape device), or any suitable combination of the above. A computer readable storage medium is defined to include a tangible medium that can contain or store program code for use by or in connection with an instruction execution system, apparatus, or device, such as a processor. The program code stored in/on the computer readable medium therefore produces an article of manufacture (such as a "computer program product") including program code.

Figure 8:
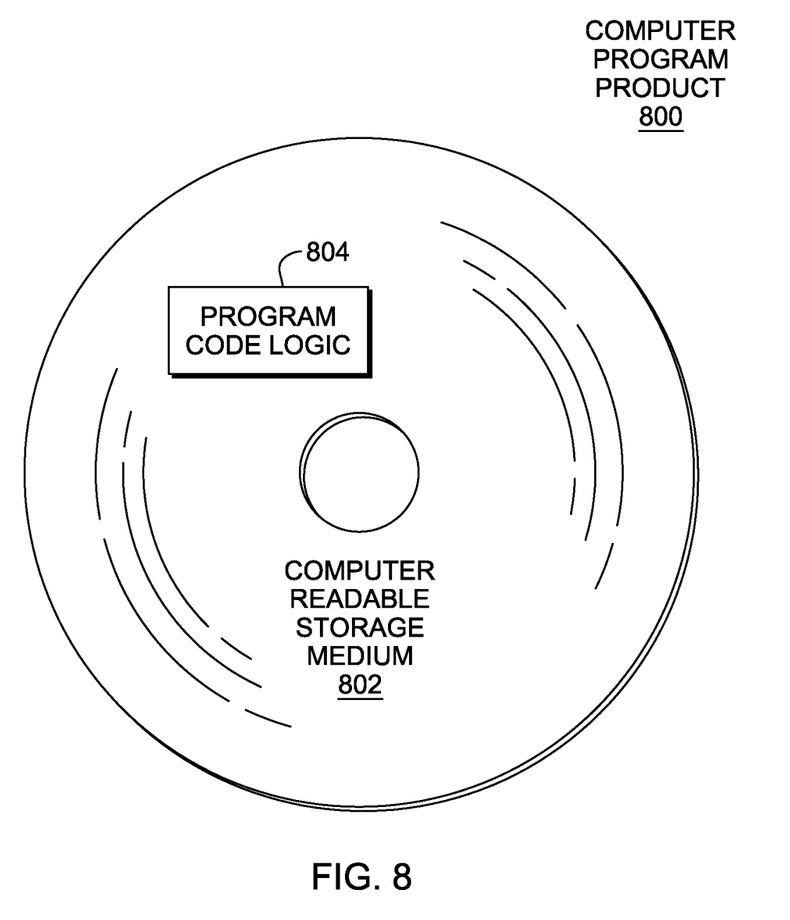
FIG. 8 depicts one embodiment of a computer program product incorporating one or more aspects described herein.

Referring now to FIG. 8, in one example, a computer program product 800 includes, for instance, one or more computer readable media 802 to store computer readable program code means or logic 804 thereon to provide and facilitate one or more aspects of the present invention.

Program code contained or stored in/on a computer readable medium can be obtained and executed by a data processing system (computer, computer system, etc. including a component thereof) and/or other devices to cause the data processing system, component thereof, and/or other device to behave/function in a particular manner. The program code can be transmitted using any appropriate medium, including (but not limited to) wireless, wireline, optical fiber, and/or radio-frequency. Program code for carrying out operations to perform, achieve, or facilitate aspects of the present invention may be written in one or more programming languages. In some embodiments, the programming language(s) include object-oriented and/or procedural programming languages such as C, C++, C#, Java, etc. Program code may execute entirely on the user's computer, entirely remote from the user's computer, or a combination of partly on the user's computer and partly on a remote computer. In some embodiments, a user's computer and a remote computer are in communication via a network such as a local area network (LAN) or a wide area network (WAN), and/or via an external computer (for example, through the Internet using an Internet Service Provider).

In one example, program code includes one or more program instructions obtained for execution by one or more processors. Computer program instructions may be provided to one or more processors of, e.g., one or more data processing system, to produce a machine, such that the program instructions, when executed by the one or more processors, perform, achieve, or facilitate aspects of the present invention, such as actions or functions described in flowcharts and/or block diagrams described herein. Thus, each block, or combinations of blocks, of the flowchart illustrations and/or block diagrams depicted and described herein can be implemented, in some embodiments, by computer program instructions.

The flowcharts and block diagrams depicted and described with reference to the Figures illustrate the architecture, functionality, and operation of possible embodiments of systems, methods and/or computer program products according to aspects of the present invention. These flowchart illustrations and/or block diagrams could, therefore, be of methods, apparatuses (systems), and/or computer program products according to aspects of the present invention.

In some embodiments, as noted above, each block in a flowchart or block diagram may represent a module, segment, or portion of code, which includes one or more executable instructions for implementing the specified behaviors and/or logical functions of the block. Those having ordinary skill in the art will appreciate that behaviors/functions specified or performed by a block may occur in a different order than depicted and/or described, or may occur simultaneous to, or partially/wholly concurrent with, one or more other blocks. Two blocks shown in succession may, in fact, be executed substantially concurrently, or the blocks may sometimes be executed in the reverse order. Additionally, each block of the block diagrams and/or flowchart illustrations, and combinations of blocks in the block diagrams and/or flowchart illustrations, can be implemented wholly by special-purpose hardware-based systems, or in combination with computer instructions, that perform the behaviors/functions specified by a block or entire block diagram or flowchart.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    evaluating electrical accessibility within a layer of a circuit to at least one established pin geometry of an established pin geometry layout within a cell boundary of the circuit, the evaluating comprising:
        checking along a plurality of substantially parallel pin geometry access paths of the layer to determine a plurality of fixed possible points at which a respective established pin geometry of the at least one established pin geometry within the cell boundary may be accessed, the pin geometry access paths being paths for possible routes of electrical connections in the layer of the circuit; and
        identifying, by a hardware processor, which points of the plurality of fixed possible points are accessible access points by any route of the possible routes for electrically connecting to a respective established pin geometry of the at least one established pin geometry from a first side or a second side of the cell boundary, wherein at least one point of the plurality of fixed possible points is identified as not being an accessible access point based on the at least one point being inaccessible by the possible routes.

2. The method of claim 1, wherein the evaluating further comprises:
    converting a specification of the at least one established pin geometry from a first polygonal specification format to a second polygonal specification format, the converting expanding coverage of a polygon of an established geometry, of the at least one established pin geometry and being of a fixed sizing and layout, in at least one direction.

3. The method of claim 2, wherein the converting expands coverage of the polygon in a direction orthogonal to the substantially parallel pin geometry access paths, wherein the expanding maximizes a number of fixed possible points at which the established pin geometry may be accessed.

4. The method of claim 1, wherein the pin geometry access paths intersect the cell boundary from the first side thereof and the second side thereof, and wherein the identifying determines, for each point of the plurality of fixed possible points, whether the point is accessible along any route of the possible routes from the first side of the cell boundary and whether the point is accessible along any route of the possible routes from the second side of the cell boundary, wherein a point is identified as not being an accessible access point based, at least in part, on the point being inaccessible from the first side and inaccessible from the second side.

5. The method of claim 4, wherein the first side and the second side are opposing sides of the cell boundary.

6. The method of claim 4, wherein the identifying determines, for each point of the plurality of fixed possible points, whether a route, of the possible routes, to the point is being obstructed from accessing the point from the first side and from the second side, wherein a point is identified as not being an accessible access point based, at least in part, on the route being obstructed from accessing the point from the first side and from the second side.

7. The method of claim 6, wherein the route is obstructed by a non-pin geometry blocking point, the non-pin geometry blocking point being a blockage due to an established non-pin geometry of the circuit, wherein the evaluating further comprises identifying the non-pin geometry blocking point, and wherein the point is determined to be inaccessible based, at least in part, on the non-pin geometry blocking point blocking the route from accessing the point from at least one of the first side or the second side.

8. The method of claim 6, wherein the identifying determines, for each point of the plurality of fixed possible points, whether the point is sufficiently enclosed within the established pin geometry accessible at that point, wherein a point is identified as not being an accessible access point based, at least in part, on the point not being sufficiently enclosed within the established in geometry accessible at that point.

9. The method of claim 1, wherein the layer of the circuit is a Metal-1 (M1) layer, wherein the at least one established pin geometry is at least one established M1 pin geometry, and wherein the evaluating evaluates electrical accessibility for M1 routes in the M1 layer to the at least one established M1 pin geometry.

10. A system comprising:
    a memory; and
    a processor in communication with the memory, wherein the system is configured to perform a method comprising:
        evaluating electrical accessibility within a layer of a circuit to at least one established pin geometry of an established pin geometry layout within a cell boundary of the circuit, the evaluating comprising:
            checking along a plurality of substantially parallel pin geometry access paths of the layer to determine a plurality of fixed possible points at which a respective established pin geometry of the at least one established pin geometry within the cell boundary may be accessed, the pin geometry access paths being paths for possible routes of electrical connections in the layer of the circuit; and
            identifying which points of the plurality of a fixed possible points are accessible access points by any route of the possible routes for electrically connecting to a respective in geometry of the at least one established pin geometry from a first side or a second side of the cell boundary, wherein at least one point of the plurality of fixed possible points is identified as not being an accessible access point based on the at least one point being inaccessible by the possible routes.

11. The system of claim 10, wherein the evaluating further comprises:
    converting a specification of the at least one established pin geometry from a first polygonal specification format to a second polygonal specification format, the converting expanding coverage of a polygon of an established pin geometry, of the at least one established pin geometry and being fixed of a fixed sizing and layout, in at least one direction.

12. The system of claim 10, wherein the pin geometry access paths intersect the cell boundary from the first side thereof and the second side thereof, and wherein the identifying determines, for each point of the plurality of fixed possible points, whether the point is accessible along any route of the possible routes from the first side of the cell boundary and whether the point is accessible along any route of the possible routes from the second side of the cell boundary, wherein a point is identified as not being an accessible access point based, at least in part, on the point being inaccessible from the first side and inaccessible from the second side.

13. The system of claim 12, wherein the identifying determines, for each point of the plurality of fixed possible points, whether a route, of the possible routes, to the point is being obstructed from accessing the point from the first side and from the second side, wherein a point is identified as not being an accessible access point based, at least in part, on the route being obstructed from accessing the point from the first side and from the second side.

14. The system of claim 13, wherein the identifying determines, for each point of the plurality of fixed possible points, whether the point is sufficiently enclosed within the established pin geometry accessible at that point, wherein a point is identified as not being an accessible access point based, at least in part, on the point not being sufficiently enclosed within the established pin geometry accessible at that point.

15. The system of claim 10, wherein the layer of the circuit is a Metal-1 (M1) layer, wherein the at least one established pin geometry is at least one established M1 pin geometry, and wherein the evaluating evaluates electrical accessibility for M1 routes in the M1 layer to the at least one established M1 pin geometry.

16. A computer program product comprising:
a tangible storage medium storing program instructions readable by a processor for execution to perform a method comprising:
evaluating electrical accessibility within a layer of a circuit to at least one established pin geometry of an established pin geometry layout within a cell boundary of the circuit, the evaluating comprising:
checking along a plurality of substantially parallel pin geometry access paths of the layer to determine a plurality of fixed possible points at which a respective established pin geometry of the at least one established pin geometry within the cell boundary may be accessed, the pin geometry access paths being paths for possible routes of electrical connections in the layer of the circuit; and identifying which points of the plurality of fixed possible points are accessible access points by any route of the possible routes for electrically connecting to a respective established pin geometry of the at least one established pin geometry from a first side or a second side of the cell boundary, wherein at least one point of the plurality of fixed possible points is identified as not being an accessible access point based on the at least one point being inaccessible by the possible routes.

17. The computer program product of claim 16, wherein the evaluating further comprises:
converting a specification of the at least one established geometry from a first polygonal specification format to a second polygonal specification format, the converting expanding coverage of a polygon of an established pin geometry, of the at least one established pin geometry and being of a fixed sizing and layout, in at least one direction.

18. The computer program product of claim 16, wherein the pin geometry access paths intersect the cell boundary from the first side thereof and the second side thereof, and wherein the identifying determines, for each point of the plurality of fixed possible points, whether the point is accessible along any route of the possible routes from the first side of the cell boundary and whether the point is accessible along any route of the possible routes from the second side of the cell boundary, wherein a point is identified as not being an accessible access point based, at least in part, on the point being inaccessible from the first side and inaccessible from the second side.

19. The computer program product of claim 18, wherein the identifying determines, for each point of the plurality of fixed possible points, whether a route, of the possible routes, to the point is being obstructed from accessing the point from the first side and from the second side, wherein a point is identified as not being an accessible access point based, at least in part, on the route being obstructed from accessing the point from the first side and from the second side, and further determines, for each point of the plurality of fixed possible points, whether the point is sufficiently enclosed within the established pin geometry accessible at that point, wherein a point is identified as not being an accessible access point based, at least in part, on the point not being sufficiently enclosed within the established pin geometry accessible at that point.

20. The computer program product of claim 16, wherein the layer of the circuit is a Metal-1 (M1) layer, wherein the at least one established pin geometry is at least one established M1 pin geometry, and wherein the evaluating evaluates electrical accessibility for M1 routes in the M1 layer to the at least one established M1 pin geometry.

* * * * *

UNITED STATES PATENT AND TRADEMARK OFFICE
CERTIFICATE OF CORRECTION

| | | |
|---|---|---|
| PATENT NO. | : 8,904,335 B2 | Page 1 of 1 |
| APPLICATION NO. | : 13/849575 | |
| DATED | : December 2, 2014 | |
| INVENTOR(S) | : Yoshida et al. | |

It is certified that error appears in the above-identified patent and that said Letters Patent is hereby corrected as shown below:

In the Claims

Column 13, Line 50: Claim 2, Delete "established geometry" and insert -- established pin geometry --

Column 14, Line 55: Claim 10, Delete "respective in geometry" and insert -- respective established pin geometry --

Column 16, Line 13: Claim 17, Delete "established geometry" and insert -- established pin geometry --

Signed and Sealed this
Seventh Day of April, 2015

Michelle K. Lee
*Director of the United States Patent and Trademark Office*